US009568581B2

(12) United States Patent
Jiang

(10) Patent No.: US 9,568,581 B2
(45) Date of Patent: Feb. 14, 2017

(54) SIGNAL SAMPLER WITH A CALIBRATION CIRCUIT

(75) Inventor: Jian Hong Jiang, Los Altos, CA (US)

(73) Assignee: FUJITSU LIMITED, Kawasaki (JP)

( * ) Notice: Subject to any disclaimer, the term of this patent is extended or adjusted under 35 U.S.C. 154(b) by 460 days.

(21) Appl. No.: 13/550,181

(22) Filed: Jul. 16, 2012

(65) Prior Publication Data

US 2014/0015543 A1 Jan. 16, 2014

(51) Int. Cl.
*G01R 35/00* (2006.01)
*G01R 13/02* (2006.01)

(52) U.S. Cl.
CPC ........... *G01R 35/00* (2013.01); *G01R 13/0272* (2013.01); *G01R 35/005* (2013.01)

(58) Field of Classification Search
CPC .............................. G01R 35/00; G01R 35/005
USPC .............................. 324/601, 750.01, 750.02, 762.01–762.03,324/762.06, 537
See application file for complete search history.

(56) References Cited

U.S. PATENT DOCUMENTS 5,933,013 A * 8/1999 Kimura ......................... 324/601
6,870,359 B1 * 3/2005 Sekel ....................... 324/750.02
7,675,312 B2 * 3/2010 Ho et al. .................. 324/762.01
2002/0098823 A1 * 7/2002 Lindfors et al. .............. 455/334
2006/0132339 A1 * 6/2006 Alon .................. H03M 1/1023 341/120
2011/0074392 A1 * 3/2011 Bartlett et al. ............. 324/76.44

OTHER PUBLICATIONS

Ho et al., "Applications of On-Chip Samplers for Test and Measurement of Integrated Circuits," Symposium on VLSI Circuits, 1998, pp. 138-139.

* cited by examiner

*Primary Examiner* — Jeff Natalini
(74) *Attorney, Agent, or Firm* — Maschoff Brennan

(57) ABSTRACT

A circuit configured to sample a signal of a source circuit and to provide calibration signals to a testing device of the signal sampled from the source circuit. The circuit may include an amplifier, a sampling circuit, and a calibration circuit. The amplifier may be configured to drive signals on an internal node to the testing device. The sampling circuit may be configured to provide a sample of a signal from the source circuit to the internal node. The calibration circuit may be configured to provide a first calibration signal and a second calibration signal to the internal node. The second calibration signal may be a known proportion of the first calibration signal.

14 Claims, 6 Drawing Sheets

SIGNAL SAMPLER WITH A CALIBRATION CIRCUIT

FIELD

The embodiments discussed herein are related to circuits for sampling signals.

BACKGROUND

A testing device, such as an oscilloscope, may be used to view or analyze analog and/or digital signals in a source circuit. For example, the testing device may be used to determine an eye opening of a signal at a receiver to measure the integrity and other aspects of the signal.

In some circumstances, the testing device may be electrically coupled to a signal interface circuit that samples a signal. The signal interface circuit may include various circuit elements that may change the sampled signal before it is transmitted to the testing device. For example, the circuit elements may amplify, degrade, or otherwise change the sampled signal. In some circumstances, to allow for more accurate viewing and/or analyses of the sampled signal from the signal interface circuit, the testing device may be calibrated to account for changes to the sampled signal.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a system may include a circuit configured to sample a signal of a source circuit and to provide calibration signals to a testing device of the signal sampled from the source circuit. The circuit may include an amplifier, a sampling circuit, and a calibration circuit. The amplifier may be configured to drive signals on an internal node to the testing device. The sampling circuit may be configured to provide a sample of the signal from the source circuit to the internal node. The calibration circuit may be configured to provide a first calibration signal and a second calibration signal to the internal node. The second calibration signal may be a known proportion of the first calibration signal.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Embodiments of the present invention will be explained with reference to the accompanying drawings.

Figure 1A:
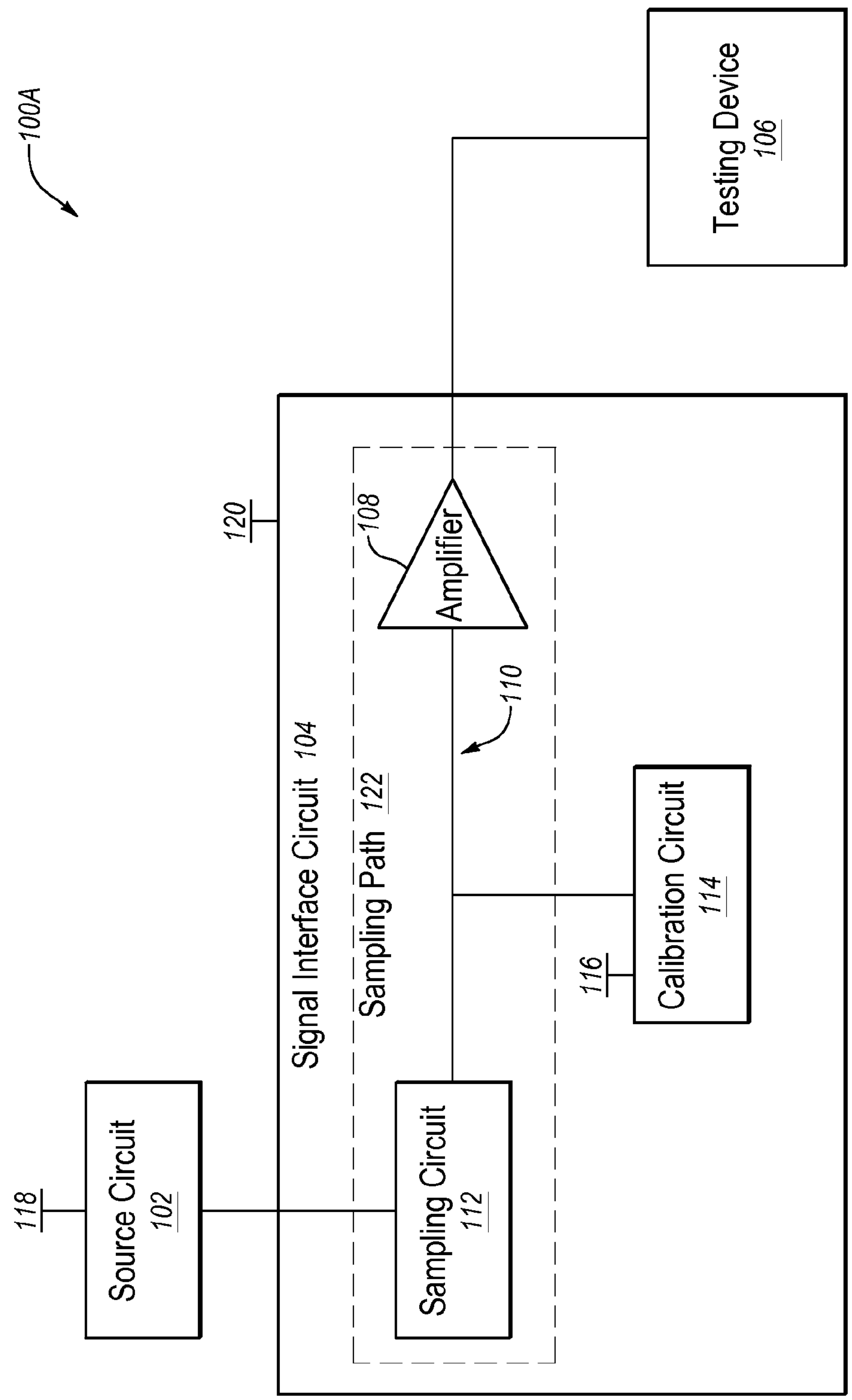
FIG. 1A is a block diagram of a signal testing system.

FIG. 1A is a block diagram of a signal testing system 100A, arranged in accordance with at least some embodiments described herein. The signal testing system 100A may include a source circuit 102, a signal interface circuit 104, and a testing device 106. Generally, the signal interface circuit 104 may be configured to sample an analog or digital signal of the source circuit 102. The sampled signal may then be communicated through the signal interface circuit 104 to the testing device 106. The testing device 106 may be configured to monitor, analyze, view, and/or otherwise test the sampled signal from the source circuit 102. The source circuit 102 may include any circuit in which electrical signals are at least temporarily present. Additionally, the testing device 106 may include any analytical or testing device used to test the sampled signal.

For example, in some embodiments of the signal testing system 100A, the source circuit 102 may be an optical receiver circuit, the testing device 106 may be an oscilloscope, and a signal in the source circuit 102 may be an electrical signal converted from an optical signal received by the optical receiver circuit. The signal interface circuit 104 may sample the signal and drive the sampled signal from the signal interface circuit 104 to the oscilloscope. The sampled signal may be viewed, analyzed, etc. at the oscilloscope.

The signal interface circuit 104 may include a sampling circuit 112 that may be configured to provide one or more samples of a signal from the source circuit 102 to an internal node 110 of the signal interface circuit 104. Some additional details of the sampling circuit 112 are provided below.

The signal interface circuit 104 may also include an amplifier 108. The amplifier 108 may be configured to drive signals on the internal node 110 to the testing device 106. In some embodiments, the amplifier 108 may have a gain that affects the signals driven to the testing device 106. Additionally, the amplifier 108 may act as a buffer between the source circuit 102 and the testing device 106. In some embodiments, the amplifier 108 may include one or more source followers.

The sampling circuit 112, the internal node 110, and the amplifier 108 generally make up a sampling path 122. The sampling path 122 may be configured to provide a signal sampled from the source circuit 102 to the testing device 106. Accordingly, the sampling path 122 may include any conductive material and/or components of the signal interface circuit 104 between the source circuit 102 and the testing device 106.

To allow the testing device 106 to compensate for the gain of the amplifier 108, the signal interface circuit 104 may also be configured to provide calibration signals to the testing device 106 using a calibration circuit 114. The calibration circuit 114 may be configured to provide a first calibration signal and a second calibration signal, which may be a known proportion of the first calibration signal, to the internal node 110. The amplifier 108 may drive the first calibration signal and the second calibration signal from the internal node 110 to the testing device 106. Based on the relationship between the first calibration signal and the second calibration signal, the testing device 106 may be calibrated to compensate for the gain of the amplifier 108.

An example of calibrating the testing device 106 follows: A first calibration signal may be driven by the amplifier 108 to the testing device 106. A second calibration signal, which may be equal to about 75% of the first calibration signal, may also be driven by the amplifier 108 to the testing device 106. The testing device 106 may measure the voltage of the first calibration signal and the second calibration signal when they are received at the testing device 106. The testing device 106 may also measure, receive, or otherwise determine the voltage of the first calibration signal or the second calibration signal before the first and second calibration signals are driven by the amplifier 108. Based on the relationship between the first calibration signal and the second calibration signal, the voltage of either the first or second calibration signal before being driven by the amplifier 108, and the voltage of the first and second calibration signals when they are received at the testing device 106, the testing device 106 may calculate a gain of the amplifier 108. Using the calculated gain of the amplifier 108, the testing device 106 may be calibrated to accommodate for the gain of the amplifier 108.

An example equation for calculating the gain of the amplifier 108 may be:

$$G=(Vo1-Vo2)/(Vin1-Vin2)$$

In the equation, G represents the gain of the amplifier 108, Vo1 represents the voltage of the first calibration signal when received at the testing device 106, Vo2 represents the voltage of the second calibration signal when received at the testing device 106, Vin1 represents the voltage of the first calibration signal before being driven by the amplifier 108, and Vin2 represents the voltage of the second calibration signal before being driven by the amplifier 108. As noted above, the value of Vo1, and Vo2, may be measured by the testing device 106 and the relationship between Vin1 and Vin2 may be known to the testing device 106. A value for Vin1 may be communicated to the testing device 106. For example, the value for Vin1 may be actively measured by the testing device 106 or may be transmitted to the testing device 106 by the signal interface circuit 104. The value for Vin2 may be calculated based on the value for Vin1 and the relationship between Vin1 and Vin2. The testing device 106 may then calculate the gain of the amplifier 108.

In some embodiments, the second calibration signal may be derived from the first calibration signal. That is, the first calibration signal may be changed in some fashion to generate the second calibration signal. For example, the first calibration signal may be a calibration circuit power supply voltage (calibration circuit voltage) 116. The second calibration signal may be derived from the first calibration signal using a voltage divider. With the first calibration signal being the calibration circuit voltage and the second calibration signals being derived from the calibration circuit voltage, which is already supplied to the calibration circuit 114, no additional signal is used to generate the first and second calibration signals. As a result, the calibration circuit 114 or the signal interface circuit 104 that may include the calibration circuit 114 may have fewer external pins than a circuit that has a calibration pin for receiving a signal used to calibrate an external testing device.

In some embodiments, the calibration circuit voltage 116 may be approximately equivalent to or equivalent to a signal interface circuit power supply voltage (interface circuit voltage) 120 and/or a source circuit power supply voltage (source circuit voltage) 118. That is, the source circuit 102, the calibration circuit 114, the signal interface circuit 104, or some combination thereof may share a common power supply voltage. Alternately, one or more of the source circuit 102, the calibration circuit 114, and/or the signal interface circuit 104, may have individual power supply voltages.

In the embodiment depicted in FIG. 1A, the calibration circuit 114 provides a first calibration signal and a second calibration signal to the testing device 106. However, this is not meant to be limiting. A second amplifier (not shown) may be configured to be coupled to a second testing device (not shown). The calibration circuit 114 may be further configured to provide the first calibration signal and the second calibration signal to a second internal node coupled to an input of the second amplifier, such that the second amplifier drives signals on the second internal node.

Figure 1B:
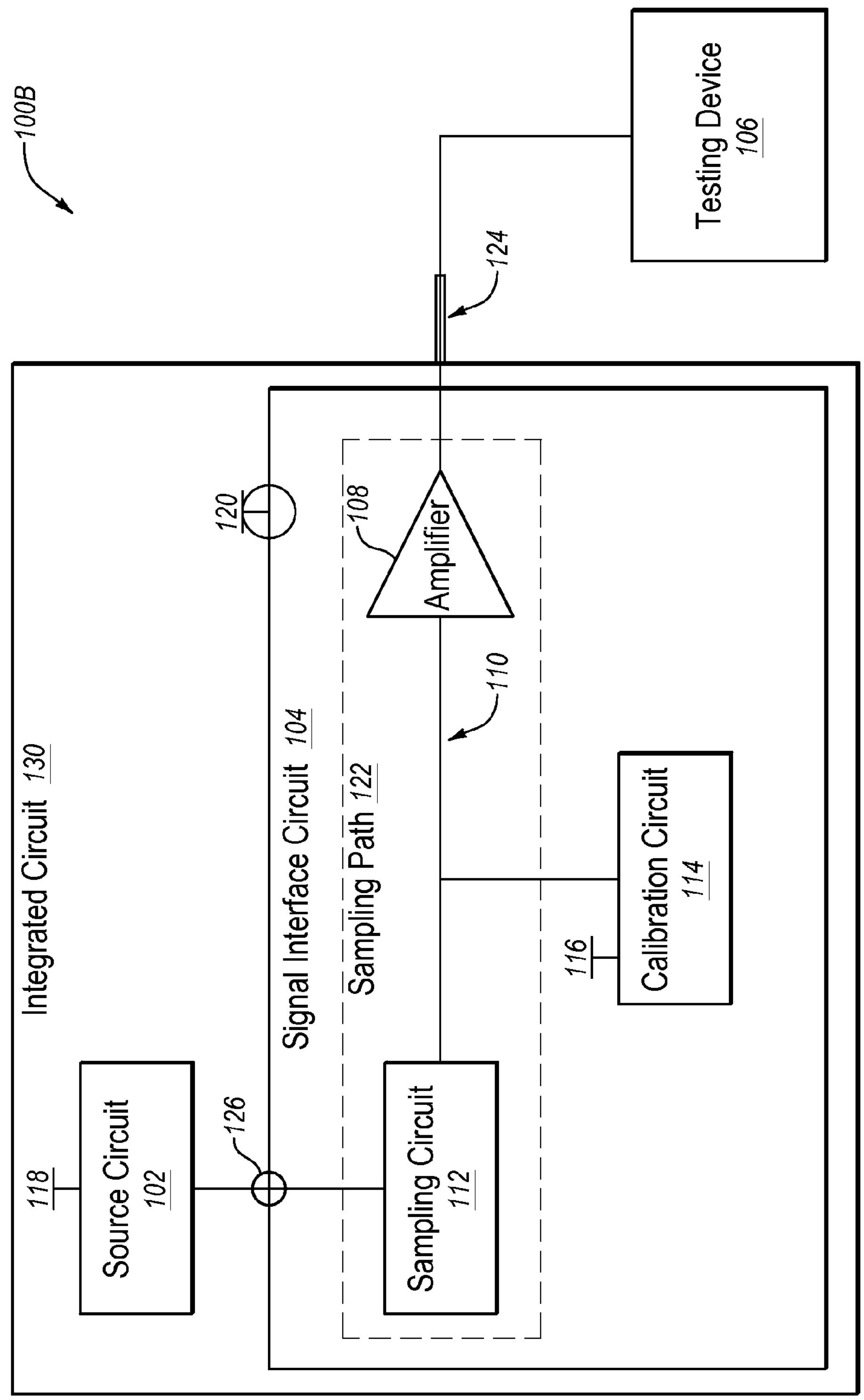
FIG. 1B is a block diagram of an example integrated signal testing system incorporating components of the signal testing system of FIG. 1A.

FIG. 1B is a block diagram of an example integrated signal testing system (integrated testing system) 100B, incorporating components of the signal testing system 100A of FIG. 1A, arranged in accordance with at least some embodiments described herein. The integrated testing system 100B includes the source circuit 102, the signal interface circuit 104, the testing device 106, and components thereof described with reference to the signal testing system 100A of FIG. 1A. In the integrated testing system 100B, the source circuit 102 and the signal interface circuit 104 are incorporated into an integrated circuit 130. Incorporated into the integrated circuit 130 as used herein refers to a single silicon die, chip, or wafer having the source circuit 102 and the signal interface circuit 104 formed therein/thereon and in communicative contact without use of an external pin.

The integrated circuit 130 includes a source node 126 that may be configured as an interface between the signal interface circuit 104 and the source circuit 102. Additionally, the integrated testing system 100B includes a testing pin 124 that may be configured to couple the integrated circuit 130 to the testing device 106. Included in the signal interface circuit 104 between the source node 126 and the device pin 124 may be a sampling path 122. The sampling path 122 may include the sampling circuit 112 and the amplifier 108. The sampling path 122 may be configured to provide an analog and/or digital signal sampled at the source node 126 to the device pin 124. More specifically, the sampling circuit 112 may be configured to control the introduction of a signal from the source node 126 to an internal node 110 of the signal interface circuit 104. The amplifier 108 may be configured to drive signals on the internal node 110 to the testing device 106 by way of the device pin 124. Additionally, the integrated circuit 130 may include the calibration circuit 114. The calibration circuit 114 may be configured to provide a first calibration signal and a known proportion of the first calibration signal to the internal node 110. Thus, when the testing device 106 is coupled to the device pin 124, the testing device 106 will receive signals driven from the amplifier 108 that enables the testing device 106 to be calibrated to accommodate for the sampling path 122.

As noted above, the first calibration signal may be the calibration circuit voltage 116. The second calibration signal may be derived from the first calibration signal. With the first calibration signal being the calibration circuit voltage 116, the second calibration signals being derived from the calibration circuit voltage 116, and the calibration circuit voltage 116 already supplied to the calibration circuit 114, no additional signal from outside the integrated circuit 130 is used to generate the first and second calibration signals. As a result, the integrated circuit 130 may have fewer external pins than an integrated circuit that has a calibration pin for receiving a signal used to calibrate an external testing device.

Alternately or additionally, the incorporation of the source circuit 102 and the signal interface circuit 104 into the integrated circuit 130 may eliminate the need for an external pin between the source circuit 102 and the signal interface circuit 104.

Figure 2:
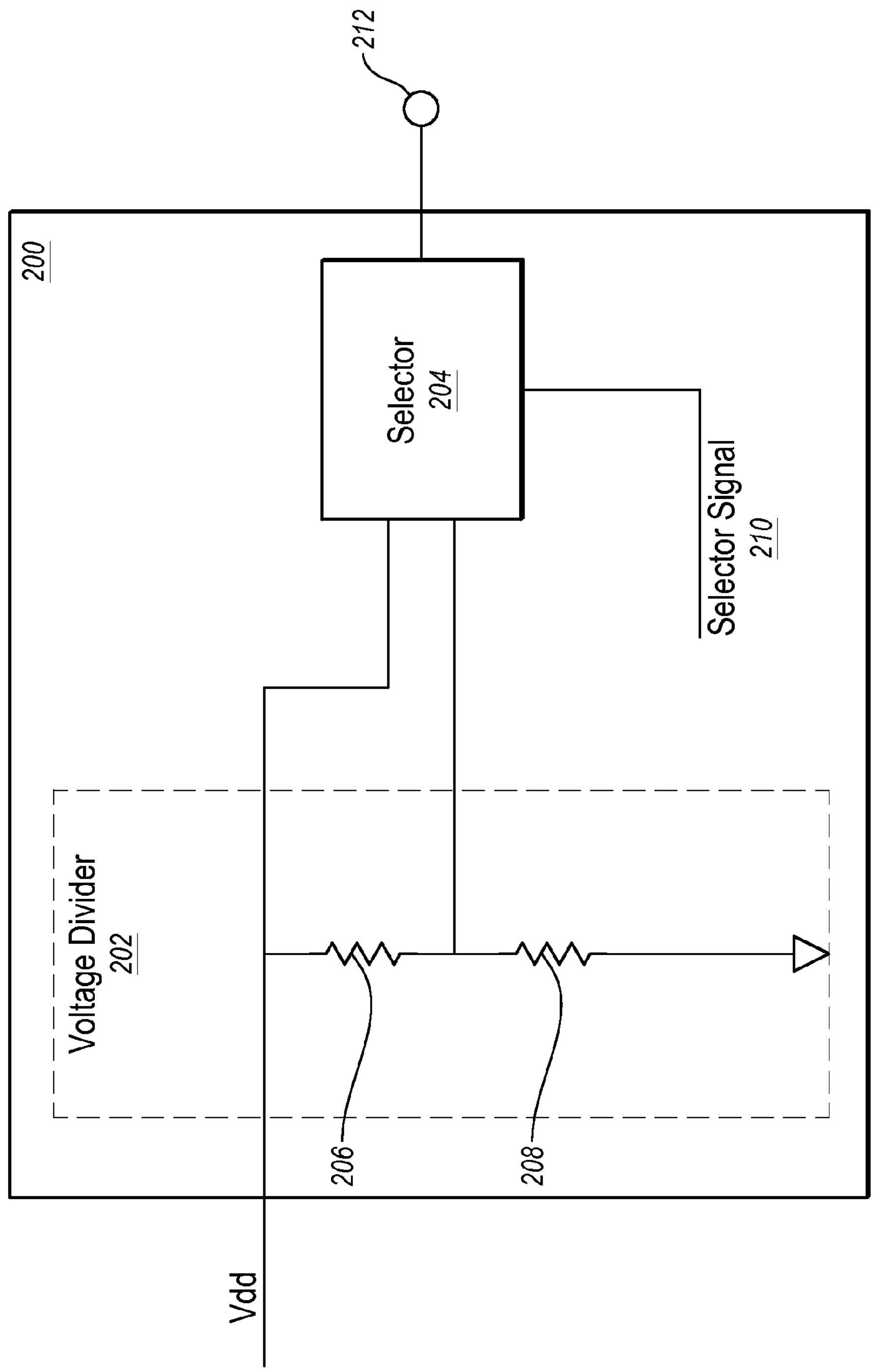
FIG. 2 is a block diagram of an example calibration circuit that may be included in the signal testing system of FIG. 1A.

FIG. 2 illustrates a block diagram of an example calibration circuit 200 that may be included in the signal testing system 100A of FIG. 1A, arranged in accordance with at least some embodiments described herein. Generally, the calibration circuit 200 may be configured to enable a second calibration signal to be derived from a first calibration signal and the first calibration signal and the second calibration signal to be provided to a node 212. In some embodiments, the calibration circuit 200 may be similar to and/or correspond to the calibration circuit 114 of FIG. 1. Alternately or additionally, the node 212 in FIG. 2 may be similar to and/or correspond to the internal node 110 in FIG. 1A.

The calibration circuit 200 may include a voltage divider 202 and a selector 204. The voltage divider 202 may be configured to receive an input signal (Vdd in FIG. 2) which may be a calibration circuit voltage or a source circuit voltage, for example. The voltage divider 202 may be configured to output a first output signal, which may be equivalent to the input signal, and a second output signal. The second output signal may be a known proportion of the first output signal. In some embodiments, the first calibration signal may be the first output signal. Additionally, the second calibration signal, which may be a known proportion of the first calibration signal, may be the second output signal.

The voltage divider 202 may include a first resistance 206 and a second resistance 208. Thus, the relationship between the second calibration signal and the first calibration signal may be described based on the following voltage divider equation:

$$V2=(R2/R1+R2)*V1$$

In the equation, V2 represents a voltage of the second calibration signal, V1 represents a voltage of the first calibration signal, R2 represents the second resistance, and R1 represents the first resistance. Thus, the relationship between the first output signal and the second output signal may be controlled by selection of the first resistance 206 and the second resistance 208. In some embodiments, each of the first resistance 206 and the second resistance 208 may include one or more resistors. For example, the first resistance 206 may include a single resistor and the second resistance 208 may include three resistors. Alternately or additionally, the first resistance 206 and/or the second resistance 208 may be any circuit element with a resistance.

Generally, the selector 204 may be configured to receive the first output signal and second output signal from the voltage divider 202 and to successively provide the first output signal and the second output signal to the node 212. That is, the selector 204 may be configured to control whether the first output signal or the second output signal is provided to the node 212.

In some embodiments, the selector 204 may also be configured to receive a selector signal 210 that controls the selector 204. The selector signal 210 may successively switch the selector 204 such that the first output signal may be provided to the node 212 while the second output signal is blocked and then the second output signal may be provided to the node 212 while the first output signal is blocked or vice versa.

Figure 3A:
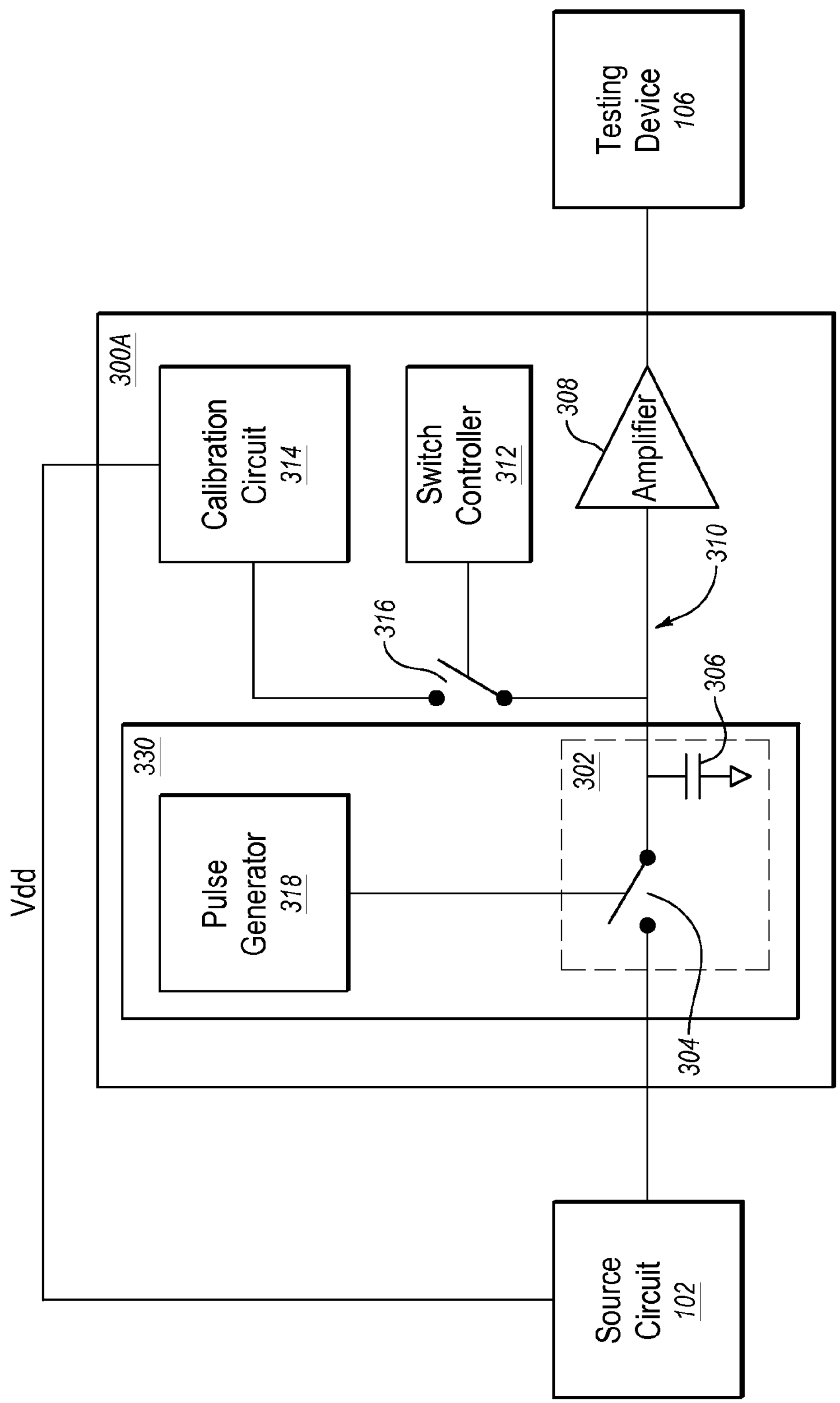
FIG. 3A is a block diagram of an example single ended signaling interface circuit that may be included in the signal testing system of FIG. 1A.

FIG. 3A is a block diagram of an example single ended signaling interface circuit (single ended circuit) 300A that may be included in the signal testing system 100A of FIG. 1A, arranged in accordance with at least some embodiments described herein. Specifically, FIG. 3A illustrates the single ended circuit 300A coupled to the source circuit 102 and the testing device 106 of FIGS. 1A and 1B.

The single ended circuit 300A may include an amplifier 308, an internal node 310, a switch controller 312, a calibration circuit 314, a calibration signal input switch 316 and a sampling circuit 330. The sampling circuit 330 may be positioned between the source circuit 102 and the internal node 310. The internal node 310 may be connected to the amplifier 308, such that the amplifier 308 may drive signals from the internal node 310 to the testing device 106. Additionally, the calibration circuit 314 may be selectively connected to the internal node 310 via the calibration signal input switch 316. The switch controller 312 may be connected to the calibration signal input switch 316 to control the state of the calibration signal input switch 316.

In some embodiments, the calibration circuit 314, the amplifier 308 and the internal node 310 may be similar to and/or correspond to the calibration circuit 114, the amplifier 108, and the internal node 110 respectively, of FIGS. 1A and 1B.

Generally, the sampling circuit 330 may be configured to provide one or more samples of a signal, such as an analog and/or digital signal, from the source circuit 102 to the internal node 310. The sampling circuit 330 may include a sample and hold circuit 302 configured to sample the signal from the source circuit 102. The sample and hold circuit 302 includes a sampling switch 304 and a sampling capacitor 306. When the sampling switch 304 closes, the signal is communicated to the sampling capacitor 306 and the internal node 310. The sampling capacitor 306 holds the voltage of the signal as the amplifier 308 drives the signal to the testing device 106.

In some embodiments, the sampling switch 304 may include a complementary-symmetry metal-oxide semiconductor (CMOS) switch. In some embodiments, the CMOS switch may include one or more CMOS transistors. Inclusion of the CMOS switch may give a bandwidth greater than alternative non-CMOS switches.

Additionally, the sampling circuit 330 may include a pulse generator 318 that may be configured to control the sampling switch 304. The pulse generator 318 may communicate a control signal to the sampling switch 304 that opens and closes the sampling switch 304, enabling the signal to be sampled. The pulse generator 318 may receive one or more clock signals as an input to assist in coordinating and/or synchronizing sampling of the signal.

The calibration signal input switch 316 may be configured to control the introduction of signals from the calibration circuit 314, such as a first calibration signal and a second calibration signal, to the internal node 310. The inclusion of the calibration signal input switch 316 may enable an additional control to the introduction of the signals from the calibration circuit 314 to the internal node 310. Thus, the calibration circuit 314 may provide the signals for a longer duration without the signals being constantly provided to the internal node 310.

For example, when providing a first calibration signal to the internal node 310, the state of the calibration signal input switch 316 might initially be open. After the calibration circuit 314 provides the first calibration signal, the calibration signal input switch 316 may close such that the first calibration signal is provided to the internal node 310. To prevent the first calibration signal from being provided to the internal node 310, the calibration signal input switch 316 may be opened and/or the calibration circuit 314 may cease to provide the first calibration signal.

Additionally, in some embodiments, the state of the calibration signal input switch 316 and the state of the sampling switch 304 may be coordinated or otherwise related. For example, while the calibration signal input switch 316 is closed, such that the first or second calibration signal is provided to the internal node 310, the sampling switch 304 may be open. Likewise, while the sampling switch 304 is closed, the calibration signal input switch 316 may be open. By coordinating the states of the calibration signal input switch 316 with the state of the sampling switch 304, only one signal (i.e., the signal sampled from the source circuit or the first or second calibration signal) may be provided to the internal node 310 at any time.

The calibration signal input switch 316 may be controlled by the switch controller 312. In some embodiments, the switch controller 312 may include an inverter that controls the state of the calibration signal input switch 316.

In the single ended circuit 300A, the calibration circuit 314 may share a power supply voltage (Vdd in FIG. 3A) with the source circuit 102. The first calibration signal may be approximately equal to the power supply voltage Vdd. In addition, the power supply voltage Vdd may be supplied to the switch controller 312, the pulse generator 318, the amplifier 308, or some combination thereof. In some embodiments, the single ended circuit 300A and the source circuit 102 may be included in a single integrated circuit.

In some embodiments, the single ended circuit 300A may include more components than those discussed above and/or illustrated in FIG. 3A. For example, the single ended circuit 300A may include one or more additional passive circuit components, such as capacitor, and/or one or more additional active circuit components.

Figure 3B:
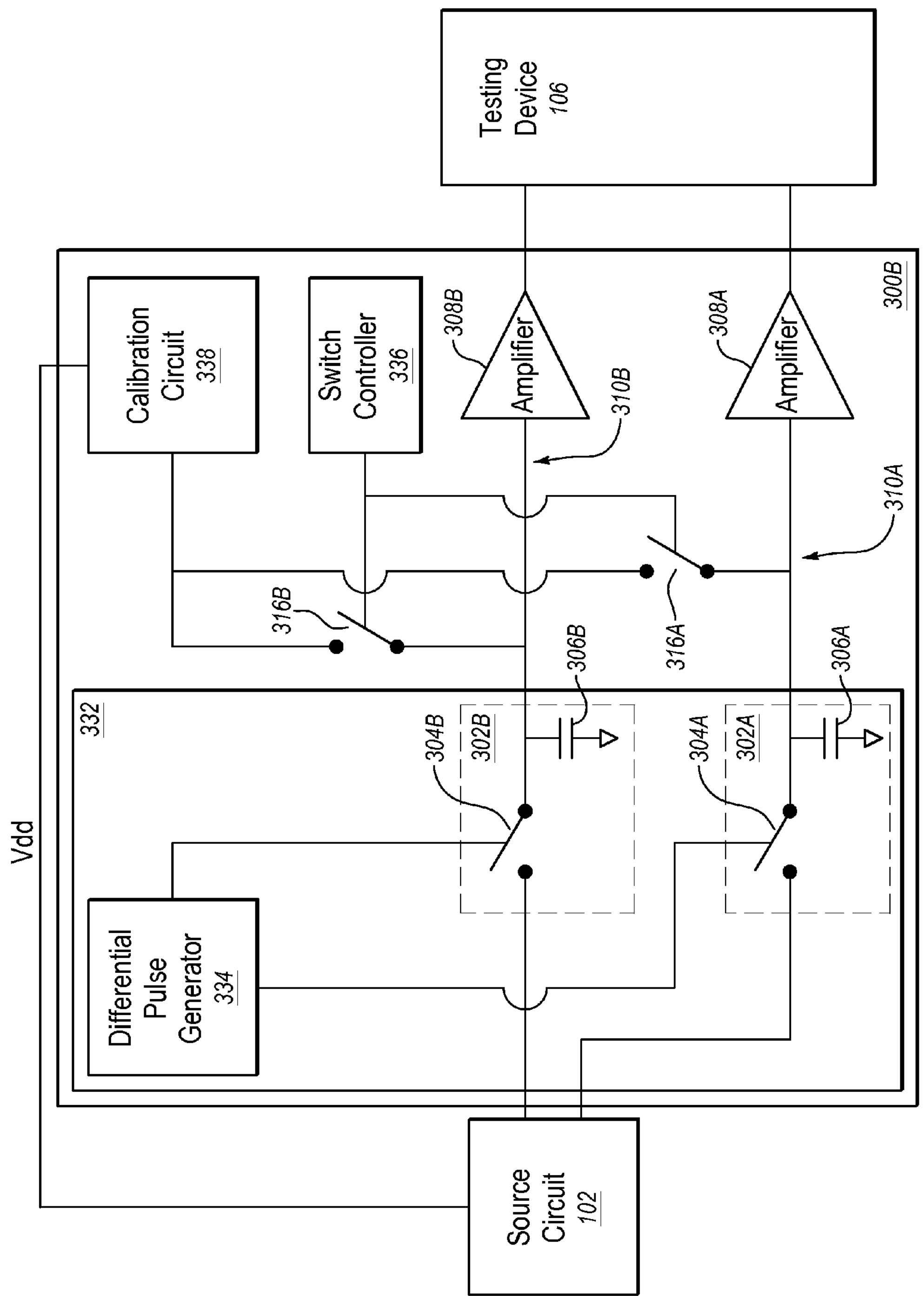
FIG. 3B is a block diagram of an example differential signaling interface circuit that may be included in the signal testing system of FIG. 1A.

FIG. 3B is a block diagram of an example differential signaling interface circuit (differential circuit) 300B that may be included in the signal testing system 100A of FIG. 1A, arranged in accordance with at least some embodiments described herein. Specifically, the differential circuit 300B illustrates an embodiment of a signal interface circuit in which the signals sampled from the source circuit 102 make up a differential signal pair. FIG. 3B illustrates the differential circuit 300B coupled to the source circuit 102 and the testing device 106 of FIGS. 1A and 1B.

The differential circuit 300B may include first and second amplifiers 308A and 308B; first and second internal nodes 310A and 310B; first and second calibration input signal switches 316A and 316B; a switch controller 336, a calibration circuit 338, and a sampling circuit 332. The sampling circuit 332 may be positioned between the source circuit 102 and the first and second internal nodes 310A and 310B. The first and second internal nodes 310A and 310B may be connected to the first and second amplifiers 308A and 308B respectively, such that the first amplifier 308A may drive signals from the first internal node 310A to the testing device 106 and the second amplifier 308B may drive signals from the second internal node 310B to the testing device 106. Additionally, the calibration circuit 338 may be selectively connected to the first and second internal nodes 310A and 310B via the first and second calibration signal input switches 316A and 316B, respectively. In particular, the calibration circuit 338 may be selectively connected to the first internal node 310A via the first calibration signal input switch 316A and may be selectively connected to the second internal node 310B via the second calibration signal input switch 316B. The switch controller 336 may be connected to the first and second calibration signal input switches 316A and 316B to control the state of the first and second calibration signal input switches 316A and 316B.

In some embodiments, each of the first and second amplifiers 308A and 308B as well as each of the first and second internal nodes 310A and 310B may be similar to and/or correspond the amplifier 308 and the internal node 310 of FIG. 3A and/or the amplifier 108 and the internal node 110 of FIGS. 1A and 1B. Additionally or alternatively, the calibration circuit 338 may be similar to and/or correspond to the calibration circuit 314 of FIG. 3A and/or the calibration circuit 114 of FIGS. 1A and 1B.

Generally, the differential circuit 300B operates similarly to the single ended circuit 300A of FIG. 3A. However, the differential circuit 300B includes the sampling circuit 332 that may be configured to provide one or more samples of a signal, such as an analog and/or digital signal, from the source circuit 102 to the first and second internal nodes 110A and 110B. The sampling circuit 332 includes a first sample and hold circuit 302A configured to sample a first signal in a differential signal pair. The sampling circuit 332 may also include a second sample and hold circuit 302B configured to sample a second signal in the differential signal pair. The first sample and hold circuit 302A may include a first sampling switch 304A and a first sampling capacitor 306A and the second sample and hold circuit 302B may include a second sampling switch 304B and a second sampling capacitor 306B. Operation of the first sample and hold circuit 302A and the second sample and hold circuit 302B is substantially similar to that described with respect to the sample and hold circuit 302 of FIG. 3A.

The sampling circuit 332 may include a differential pulse generator 334. The differential pulse generator is similar to the pulse generator 308 described with reference to FIG. 3A. In the differential circuit 300B, the differential pulse generator 334 may be configured to control the first sample and hold circuit 302A and the second sample and hold circuit 302B. That is, the differential pulse generator 334 may control the state of the first sampling switch 304A and the second sampling switch 304B. One or both of the first sampling switch 304A and the second sampling switch 304B may include CMOS switches or one or more CMOS transistors.

Additionally, the differential circuit 300B may include the first and second calibration signal input switches 316A and 316B. The first calibration signal input switch 316A may be configured to control the introduction of signals from the calibration circuit 338, such as a first calibration signal and a second calibration signal to the first internal node 310A. Similarly, a second calibration signal input switch 316B may be configured to control the introduction of the signals from the calibration circuit 338 to the second internal node 310B. An example embodiment in which the differential circuit 300B includes the first and second calibration signal input switches 316A and 316B may include when the first calibration signal and the second calibration signal are successively provided to the first and second internal nodes 310A and 310B. That is, the first calibration signal is provided to the first and second internal nodes 310A and 310B, and then the second calibration signal is provided to the first and second internal nodes 310A and 310B, for instance. In this and other embodiments, the first calibration signal and the second calibration signal may be successively provided to the first and second internal nodes 310A and 310B through the first and second calibration signal input switches 316A and 316B, simultaneously, with some period of overlapping duration, or in sequence.

However, the differential circuit 300B is not limited to embodiments including the first and second calibration signal input switches 316A and 316B. For example, in embodiments in which the first calibration signal is simultaneously provided to the first and second internal nodes 310A and 310B, and then the second calibration signal is simultaneously provided to the first and second internal nodes, a single calibration signal input switch such as the calibration input switch 316 of FIG. 3A, may be included in the differential circuit 300B.

The first and second calibration signal input switches 316A and 316B may be controlled by a switch controller 336. The switch controller 336 included in the differential circuit 300B may be similar to the switch controller 312 in FIG. 3A. However, the switch controller 336 may interface with the first and second calibration signal input switches 316A and 316B. Thus, the switch controller 336 may include the capability to alternatively, sequentially, or collectively change the state of the first and second calibration signal input switches 316A and 316B. In some embodiments, the switch controller 336 may include an inverter that controls the state of the first and second calibration signal input switches 316A and 316B.

Additionally, in some embodiments, the states of the first and second calibration signal input switches 316A and 316B and the states of the first and second sampling switches 304A and 304B may be coordinated or otherwise related. By coordinating the states of the first and second calibration signal input switches 316A and 316B with the states of the first and second sampling switches 304A and 304B, the introduction of various signals (i.e., signals sampled from the source circuit or the first or second calibration signals) to the first and second internal nodes 310A and 310B may be controlled and/or sequenced.

In the differential circuit 300B the calibration circuit 338 may receive a power supply voltage (Vdd in FIG. 3B) from the source circuit 102. The first calibration signal may be approximately equal to the power supply voltage Vdd. In addition, the power supply voltage Vdd may be supplied to the switch controller 336, the differential pulse generator 334, the first and second amplifiers 308A and 308B, or some combination thereof. Like the integrated testing system 100B, one or more of the components included in the differential circuit 300B may be included in an integrated circuit with the source circuit 102.

In some embodiments, the differential circuit 300B may include more components than those discussed above and/or illustrated in FIG. 3B. For example, the differential circuit 300B may include one or more additional passive circuit components, such as capacitor, and/or one or more additional active circuit components.

Figure 4:
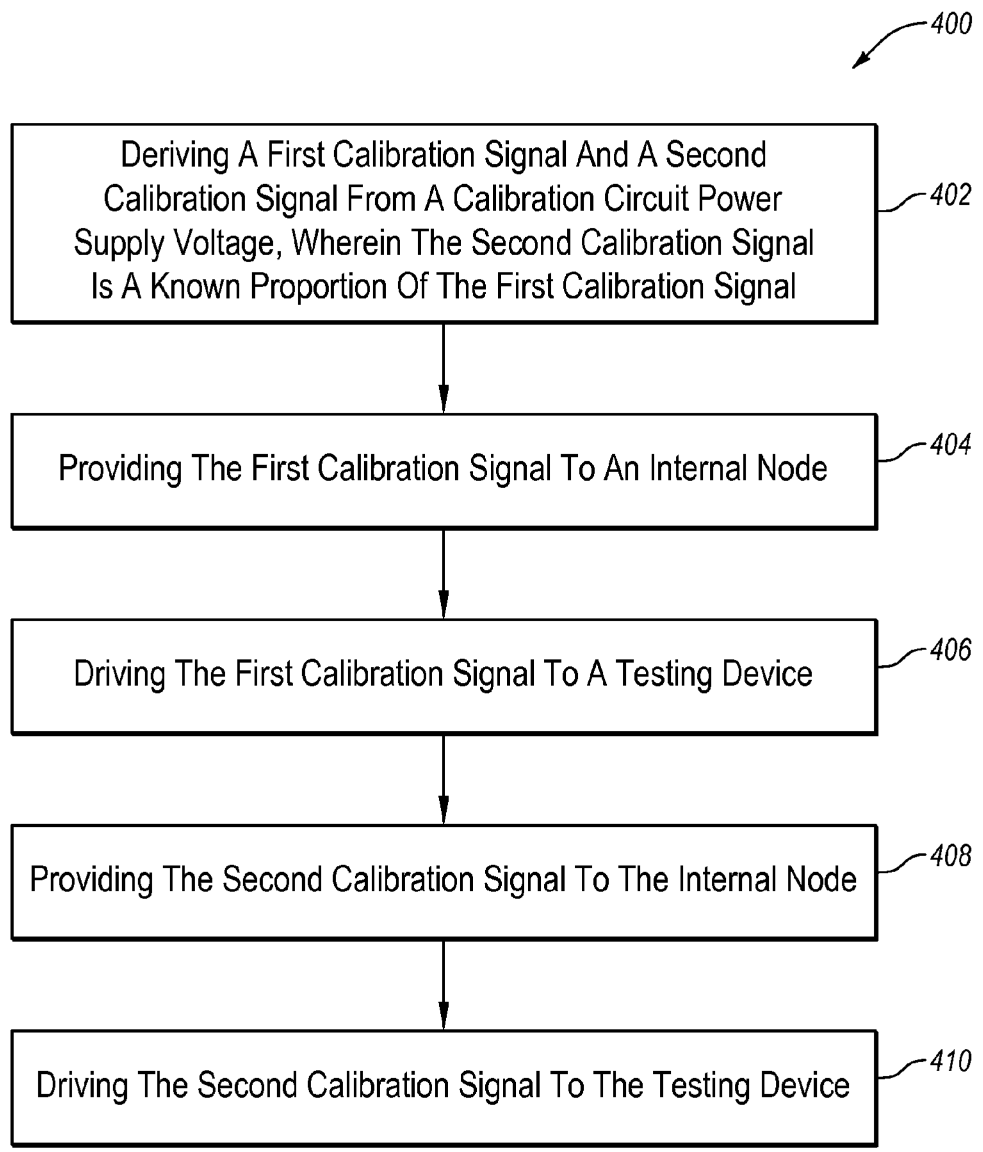
FIG. 4 is a flow diagram of an example method of calibrating a testing device configured to observe a signal sampled from a source circuit, all arranged in accordance with at least some embodiments described herein.

FIG. 4 is a flow diagram of an example method 400 of calibrating a testing device configured to observe a signal sampled from a source circuit, arranged in accordance with at least some embodiments described herein. The method 400 may be implemented in the signal testing system 100A of FIG. 1A or the integrated testing system 100B of FIG. 1B and may be performed by the signal interface circuit 104 of FIGS. 1A and 1B, the single ended circuit 300A of FIG. 3A, or the differential circuit 300B of FIG. 3B.

The method 400 may begin at 402 by deriving a first calibration signal and a second calibration signal from a calibration circuit power supply voltage (calibration circuit voltage). The second calibration signal may be a known proportion of the first calibration signal and the second calibration signal may be derived from the first calibration signal. In some embodiments, the first calibration signal may be the calibration circuit voltage. That is, the first calibration signal may be about equivalent to the calibration circuit voltage and the second calibration signal may be some derivation of the calibration circuit voltage. The calibration circuit voltage may be a common power supply voltage that may be shared and/or provided by a source circuit. In some embodiments, the source circuit may be incorporated in an integrated circuit with the calibration circuit. For example, the first calibration signal may be approximately equal to the calibration circuit voltage, which may be divided by a known proportion to derive the second calibration signal.

After deriving the first and second calibration signals, the first and second calibration signals may be successively selected between for providing to another circuit and/or node. The successive selection may be controlled and/or synchronized by another signal, for example.

At 404, the method 400 may include providing the first calibration signal to an internal node coupled to an amplifier. The amplifier may be configured to drive signals from the internal node to the testing device.

In some embodiments, introduction of the first calibration signal to the internal node may be controlled. For example, the introduction of the first calibration signal to the internal node may be controlled by altering the state of a switch. That is, when the switch is open, the first calibration signal may be prevented from being provided to the internal node. When the switch is closed, the first calibration signal may be provided to the internal node.

Additionally, any mechanism controlling the introduction of the first calibration signal to the internal node may additionally be controlled or synchronized by another signal and/or component. For example, a switch controller may control the switch.

At 406, the method 400 may include driving the first calibration signal to the testing device. Generally, when the first calibration signal is communicated to the internal node, the first calibration signal is driven by the amplifier to the testing device. When driven by the amplifier, the first calibration signal may be affected by a gain of the amplifier, for example. Thus, the testing device may receive a first driven signal, which relates to the first calibration signal, but may not be identical to the first calibration signal. In some embodiments, the amplifier may include a source follower.

At 408, the method 400 may include providing the second calibration signal to the internal node. As discussed above, introduction of the second calibration signal to the internal node may be controlled such as through controlling of the state of one or more switches. The one or more switches may additionally be electronically controlled or synchronized by another signal and/or component.

In some embodiments, a voltage of the first calibration signal and/or the second calibration signal is communicated to the testing device. The voltage of the first and/or second calibration signal(s) may be used in a calculation for calibrating the testing device. The testing device may actively measure the voltage of the first or second calibration signal(s). Alternatively, a signal interface circuit may actively transmit or make available the voltage of the first or second calibration signal(s).

At 410, the method 400 may include driving the second calibration signal to the testing device. Generally, when the second calibration signal is communicated to the internal node, the second calibration signal is driven by the amplifier to the testing device. When driven by the amplifier, the second calibration signal may be affected by the gain of the amplifier, for example. Thus, the testing device may receive a second driven signal, which relates to the second calibration signal, but may not be identical to the second calibration signal.

In some embodiments, the testing device may calculate the gain of the amplifier from the first driven signal, the second driven signal, the first calibration signal, and the known proportion between the first calibration signal and the second calibration signal.

Additionally or alternatively, the signal sampled from the source circuit may make up a first signal of a differential signal pair. In embodiments in which the signal sampled from the source circuit may make up a first signal of a differential signal pair, a system that performs method 400 may include multiple amplifiers, multiple inputs to amplifiers, multiple calibration input signal switches, or some combination thereof.

One skilled in the art will appreciate that, for this and other procedures and methods disclosed herein, the functions performed in the processes and methods may be implemented in differing order. For example, providing the first calibration signal to the internal node coupled to the amplifier and driving the first calibration signal to the testing device may be performed after providing the second calibration signal to the internal node coupled to the amplifier and driving the second calibration signal to the testing device.

Furthermore, the outlined steps and operations are only provided as examples, and some of the steps and operations may be optional, combined into fewer steps and operations, or expanded into additional steps and operations without detracting from the disclosed embodiments.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit configured to sample a signal of a source circuit and to provide calibration signals to a testing device of the signal sampled from the source circuit, the circuit comprising:

an amplifier configured to drive signals on an internal node to the testing device;

a sampling circuit configured to provide a sample of the signal from the source circuit to the internal node; and a calibration circuit configured to provide both a first calibration voltage and a second calibration voltage to the internal node for calibration of the testing device with respect to the sample of the signal, wherein the second calibration voltage is different from and a constant known proportion of the first calibration voltage, and the second calibration voltage is derived from the first calibration voltage using a voltage divider circuit such that the first calibration voltage and the second calibration voltage always have the same polarity.

2. The circuit of claim 1, wherein the calibration circuit further comprises:

a selector configured to control whether the first calibration voltage or the second calibration voltage is provided to the internal node.

3. The circuit of claim 1, wherein the first calibration voltage comprises a circuit power supply voltage.

4. The circuit of claim 1, wherein the signal is a differential signal that includes a first signal and a second signal, wherein the sampling circuit comprises:

a first sample and hold circuit configured to sample the first signal;

a second sample and hold circuit configured to sample the second signal; and a pulse generator configured to control the first sample and hold circuit and the second sample and hold circuit.

5. The circuit of claim 1, further comprising a second amplifier configured to be coupled to a second testing device, wherein the calibration circuit is further configured to provide the first calibration voltage and the second calibration voltage to a second internal node coupled to an input of the second amplifier.

6. An integrated circuit comprising:

a source circuit configured to provide a signal;

a signal interface circuit;

a source node configured as an interface between the signal interface circuit and the source circuit; and a device pin configured to be coupled to a testing device;

the signal interface circuit including:

a sampling path configured to provide the signal from the source node to the device pin, the sampling path including:

a sampling circuit configured to control introduction of the signal from the source node to an internal node, and an amplifier configured to drive signals on the internal node to the device pin; and a calibration circuit configured to provide both a first voltage and a second voltage to the internal node such that the first voltage and the second voltage are driven to the device pin by the amplifier for calibration of the testing device with respect to the signal, wherein of the first voltage is different from but a constant known proportion of the second voltage, and the second voltage is derived from the first voltage using a voltage divider circuit such that the first voltage and the second voltage always have the same polarity.

7. The integrated circuit of claim 6, wherein the first voltage is a power supply voltage of the source circuit.

8. The integrated circuit of claim 6, wherein the calibration circuit further comprises:

a selector configured to receive the first voltage and the second voltage and successively provide the first voltage and the second voltage to the internal node.

9. The integrated circuit of claim 6, further comprising:

a calibration signal input switch configured to control introduction of the first voltage and the second voltage to the internal node.

10. The integrated circuit of claim 6, wherein the signal sampled from the source circuit comprises a first signal of a differential signal.

11. The integrated circuit of claim 6, wherein the amplifier comprises a source follower.

12. A method of calibrating a testing device configured to observe a signal sampled from a source circuit, the method comprising:

deriving a first calibration voltage from a calibration circuit power supply voltage;

deriving a second calibration voltage from the first calibration voltage using a voltage divider circuit such that the first calibration voltage and the second calibration voltage always have the same polarity, wherein the second calibration voltage is different from and a constant known proportion of the first calibration voltage;

providing the first calibration voltage to an internal node;

driving the first calibration voltage to a testing device;

providing the second calibration voltage to the internal node;

driving the second calibration voltage to the testing device; and after driving the first and second calibration voltages to the testing device to calibrate the testing device, driving a sample of the signal from the source circuit to the testing device for observation based on the calibration of the testing device.

13. The method of claim 12, wherein the first calibration voltage comprises the calibration circuit power supply voltage, the method further comprising:

dividing the calibration circuit power supply voltage to derive the second calibration voltage using the voltage divider circuit; and successively selecting the first calibration voltage and the second calibration voltage to provide to the internal node.

14. The method of claim 13, wherein the calibration circuit power supply voltage comprises a source circuit power supply voltage.

* * * * *